(12) United States Patent  
Carr et al.

(10) Patent No.: US 8,234,777 B2
(45) Date of Patent: Aug. 7, 2012

(54) LOW PROFILE AND COMPACT SURFACE MOUNT CIRCULATOR ON BALL GRID ARRAY

(75) Inventors: James A. Carr, Fountain Valley, CA (US); Tamrat Akale, Azusa, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/197,674

(22) Filed: Aug. 3, 2011

(65) Prior Publication Data

US 2011/0290862 A1    Dec. 1, 2011

Related U.S. Application Data

(62) Division of application No. 12/220,993, filed on Jul. 30, 2008, now Pat. No. 8,040,199.

(51) Int. Cl.
    *H01P 1/38*    (2006.01)
(52) U.S. Cl. .......................................... 29/600; 333/1.1
(58) Field of Classification Search ................... 333/1.1, 333/24.2; 29/600, 601
    See application file for complete search history.

(56) References Cited

U.S. PATENT DOCUMENTS

| 5,129,099 A * | 7/1992 | Roberts ........................... 455/81 |
| 6,914,496 B2 | 7/2005 | Tanaka |
| 2006/0226924 A1 | 10/2006 | Chen et al. |

* cited by examiner

*Primary Examiner* — Stephen Jones
(74) *Attorney, Agent, or Firm* — Christie, Parker & Hale, LLP

(57) ABSTRACT

A surface mount circulator. The novel circulator includes a substrate, a predetermined number of microstrip lines disposed on a first surface of the substrate, a ground layer and a predetermined number of electrical contacts disposed on the second surface of the substrate, and a mechanism for coupling each microstrip line to one of the electrical contacts. In an illustrative embodiment, the circulator uses edge wrap metallization to wrap a microstrip line down a side of the substrate to connect with a corresponding contact. A ball grid array can then be used to connect the signal contacts and ground at the second surface of the substrate with a circuit board. The circulator also includes a magnet on first surface of the substrate over a resonator circuit connecting the microstrip lines and a pole piece on the second surface of the substrate beneath the ground to provide magnetic bias to the substrate.

15 Claims, 2 Drawing Sheets

LOW PROFILE AND COMPACT SURFACE MOUNT CIRCULATOR ON BALL GRID ARRAY

CROSS-REFERENCE TO RELATED APPLICATIONS

The present application is a division of U.S. patent application Ser. No. 12/220,993 filed on Jul. 30, 2008 now U.S. Pat. No. 8,040,199.

BACKGROUND OF THE INVENTION

1. Field of the Invention

The present invention relates to microwave electronics. More specifically, the present invention relates to systems and methods for mounting circulators.

2. Description of the Related Art

A circulator is an electronic component with three or more ports that forces signals to travel between the ports in a particular direction. For example, in a three-port circulator, a signal fed to the first port is coupled to the second port only, a signal fed to the second port is coupled to the third port, and a signal fed to the third port is coupled to the first port. Circulators are commonly used in the front end of a RADAR system to couple a signal from a transmitter to an antenna, and a signal from the antenna to a receiver. A circulator can also be used as an isolator by adding a matched load to one of the ports.

Mounting and packaging front end circulators has always been a challenging task. The standard method of mounting circulators onto a printed circuit board includes attaching the ground plane of the circulator onto the board using a conductive epoxy and then wire bonding the signal ports to the board, typically using specialized selective gold plating. This process is inconsistent with typical low cost solder re-flow attach of integrated circuits to printed circuit boards and adds significant cost. An alternative approach is using rigid metal tabs to solder the signal ports to the circuit board. This approach involves a complex packaging for the circulator and a cavity cut out of the circuit board for proper mounting.

Several newer packaging technologies, such as pin grid array (PGA) and ball grid array (BGA), are available for mounting integrated circuits or chips that are simpler, cheaper, and more robust than wire bonding. However, these surface mounting techniques typically are not suitable for mounting circulators.

For example, a ball grid array (BGA) is a type of surface-mount packaging commonly used for mounting integrated circuits. A BGA mounted chip includes a plurality of electrical contacts arranged in a grid pattern on one surface of the chip and an array of solder balls attached to the electrical contacts. The chip is placed onto a circuit board having copper pads in a pattern that matches the array of solder balls, and then heated until the solder balls melt, thereby attaching the chip to the board. A BGA chip can therefore be mounted using a simple, single solder flow process, even if the chip includes hundreds of contacts.

Circulators, however, typically cannot be mounted using a BGA because of the geometry of a circulator. A circulator typically includes microstrip transmission lines for coupling the various ports. The microstrip signal lines are etched on a ferrite substrate over a ground plane, and a magnet is placed on top of the substrate over the microstrip lines. A magnetic return or pole piece is placed on the bottom of the substrate to direct the magnetic field of the magnet through the substrate, forcing signals to travel in the desired direction between the microstrip lines.

A conventional circulator therefore cannot be BGA mounted because the signal lines and ground are on opposite sides of the substrate. Integrated circuits typically use coplanar waveguides so that the signal lines and ground are all in the same plane. Conventional circulators, however, cannot use coplanar waveguides because the signals need to travel through the magnetized ferrite between the signal and ground planes in order for the circulator to function properly. Also, the additional components (the magnet and pole piece) above and below the signal lines and ground, respectively, can make it more difficult to package and mount a circulator.

Hence, a need exists in the art for an improved system or method for mounting circulators that is less complex, less expensive, and more robust than prior approaches.

SUMMARY OF THE INVENTION

The need in the art is addressed by the surface mount circulator of the present invention. The novel circulator includes a substrate, a predetermined number of microstrip lines disposed on a top of the substrate, a ground layer and a predetermined number of electrical contacts disposed on the bottom of the substrate, and a mechanism for coupling each microstrip line to one of the electrical contacts. In an illustrative embodiment, the circulator uses edge wrap metallization to wrap a microstrip line down a side of the substrate to connect with a corresponding contact. A ball grid array can then be used to connect the signal contacts and ground at the bottom of the substrate with a circuit board. The circulator also includes a magnet on top of the substrate over a resonator circuit part of the microstrip lines and a pole piece on the bottom of the substrate beneath the ground for providing a magnetic field in the substrate between the microstrip lines and the ground such that signals are coupled between the microstrip lines in a particular direction. In a preferred embodiment, the pole piece is smaller than the substrate such that the signal contacts and part of the ground are not covered by the pole piece.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

The present invention provides a novel circulator design that is compatible with ball grid arrays or other types of surface mounting. The circulator uses a novel edge wrap metallization to bring signals from microstrip transmission lines on the top of the circulator substrate down to the bottom of the substrate, which includes electrical contact pads coupled to the edge wrapped signal lines as well as a ground plane. In an illustrative embodiment, the pole piece of the circulator is smaller than the substrate, allowing the signal contact pads and the ground on the bottom of the substrate to be connected to a printed circuit board by a plurality of solder balls having a thickness greater than the thickness of the pole piece.

Figure 1A:
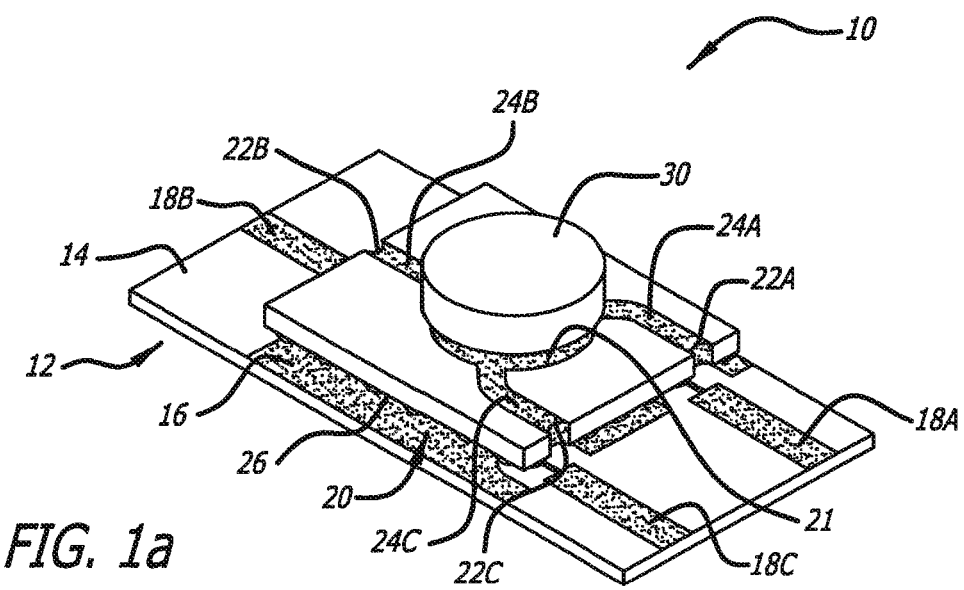
FIG. 1a is a top view diagram of a circulator and circuit board assembly designed in accordance with an illustrative embodiment of the present invention.
Figure 1B:
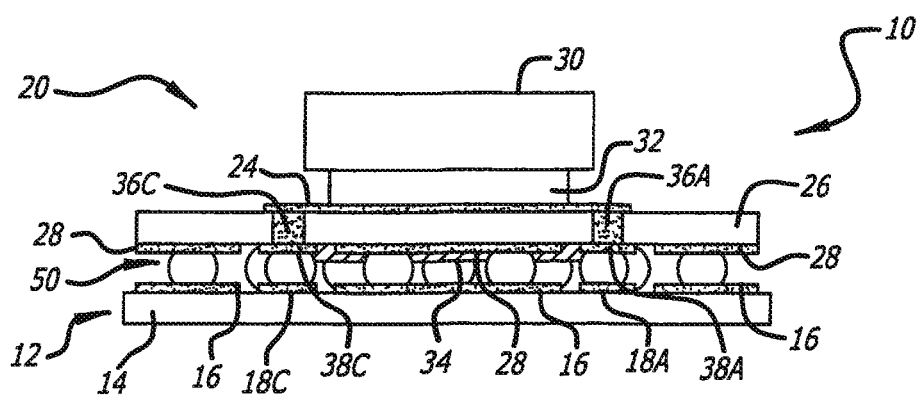
FIG. 1b is a side view diagram of a circulator and circuit board assembly designed in accordance with an illustrative embodiment of the present invention.

FIGS. 1a and 1b show a top view and a side view, respectively, of a circulator and circuit board assembly 10 designed in accordance with an illustrative embodiment of the present invention. The illustrative assembly 10 includes a novel circulator 20 mounted on a printed circuit board 12 by a ball grid array (BGA) 50.

As shown in FIG. 1a, the printed circuit board 12 includes conductive pads 16 and traces 18 etched onto a circuit board substrate 14 for connecting various electrical components mounted on the board 12. For mounting a circulator 20, the board 12 includes a conductive pad 16 to be connected to the ground 28 of the circulator 20, and conductive traces 18 to be connected to the signal ports 22 of the circulator 20.

In an illustrative embodiment for a radar application, the circulator 20 is a three-port circulator, and the circuit board 12 includes three traces 18: a first trace 18A for connecting the first signal port 22A of the circulator 20 to a transmitter, a second trace 18B for connecting the second port 22B to an antenna, and a third trace 18C for connecting the third port 22C to a receiver. (The transmitter, antenna, and receiver are separate components not shown in the figures.)

Figure 2A:
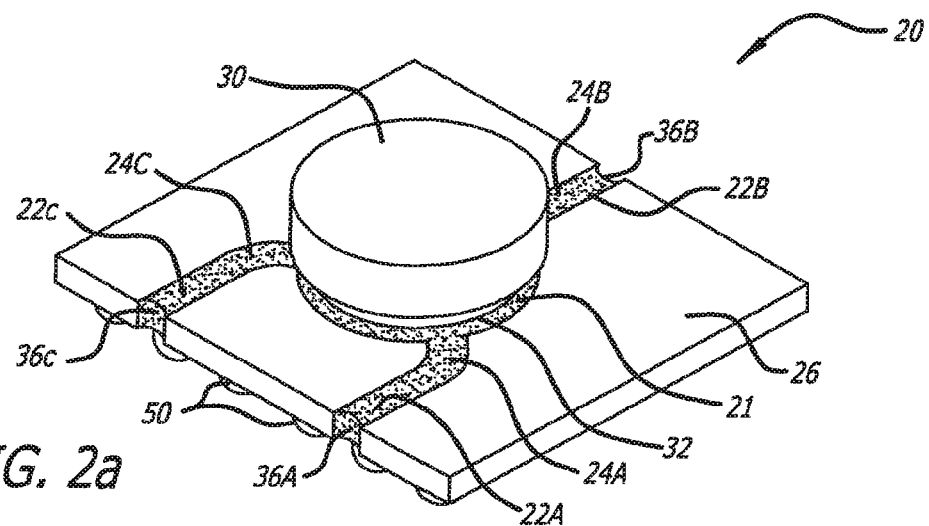
FIG. 2a is a top view diagram of a circulator designed in accordance with an illustrative embodiment of the present invention.
Figure 2B:
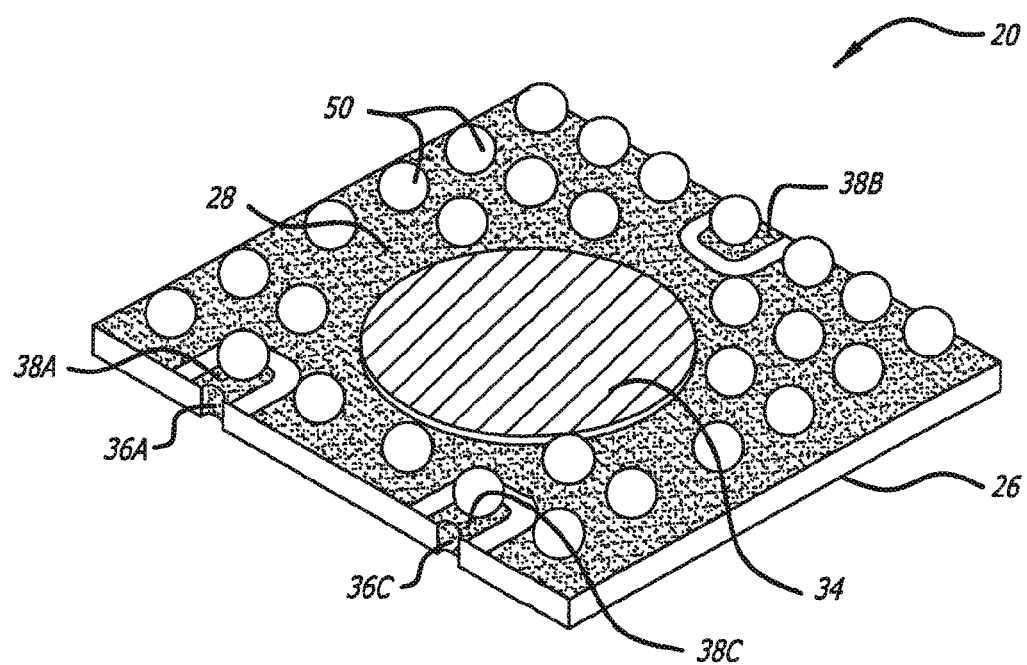
FIG. 2b is a bottom view diagram of a circulator designed in accordance with an illustrative embodiment of the present invention.

FIGS. 2a and 2b show a top view and a bottom view, respectively, of a circulator 20 designed in accordance with an illustrative embodiment of the present invention. The circulator 20 includes a resonator circuit 21 coupled to a plurality of signal ports 22 by microstrip transmission lines 24. In the illustrative embodiment, the circulator 20 includes three signal ports 22: a first port 22A at the end of a first transmission line 24A, a second port 22B at the end of a second transmission line 24B, and a third port 22C at the end of a third transmission line 24C.

The resonator circuit 21 and signal transmission lines 24 (shown in FIG. 2a) are etched on the top of the circulator substrate 26 and a ground layer 28 (shown in FIG. 2b) is disposed on the bottom of the substrate 26. The circulator substrate 26 is made from a high resistivity magnetic material such as ferrite.

A permanent magnet 30 is attached to the top of the substrate 26 over the resonator circuit 21. A foam spacer 32 (seen most clearly in FIG. 1b) separates the magnet 30 from the transmission lines 24 and substrate 26. The spacer 32 can be made from any material with a low dielectric constant, preferably as close to air as possible.

A pole piece 34 (seen most clearly in FIG. 2b) is attached to the bottom of the substrate 26 beneath the ground layer 28. The pole piece 34 is a layer of magnetic material, such as magnetic stainless steel, that directs the magnetic field of the magnet 30 straight down through the ferrite substrate 26. The magnetic field in the substrate 26 forces signals to travel through the transmission lines 24 between the signal ports 22 in a particular direction. For example, in the illustrative embodiment, signals fed to the first port 22A are coupled to the second port 22B, signals fed to the second port 22B are coupled to the third port 22C, and signals fed to the third port 22C are coupled to the first port 22A.

In accordance with the present teachings, edge wrap metallization 36 is used to couple signals from the transmission lines 24 on the top of the substrate 26 down the sides of the substrate 26 to corresponding conductive pads 38 on the bottom of the substrate 26. Edge wrap metallization involves adding a conductive line 36 disposed on the side of the substrate 26 to connect conductive layers 24 and 38 on the top and bottom, respectively, of the substrate 26. Thus, a signal travels along the transmission line 24 on the top of the substrate 26, over the edge and down the side of the substrate 26 along an edge wrap metallization line 36, to the conductive pad 38 on the bottom of the substrate 26.

In the illustrative embodiment, the bottom of the circulator substrate 26 includes three conductive signal pads 38A, 38B, and 38C that are coupled to the three transmission lines 24A, 24B, and 24C, respectively, by edge wrap metallization lines 36A, 36B, and 36C, respectively. The bottom of the substrate 26 therefore includes the signal pads 38A, 38B, and 38C, and a ground layer 28 that covers the bottom of the substrate 26 except for a small area around each signal pad 38A, 38B, and 38C.

In a preferred embodiment, the pole piece 34 is smaller than the substrate 26, as shown in FIG. 2b, so that the ground 28 and signal pads 38 are not completely covered. In most conventional circulator designs, the pole piece completely covers the bottom of the substrate and is plated with conductive material such as gold, such that the pole piece acts as both the magnetic return and the ground layer. The ground can then be easily connected to a circuit board by attaching the pole piece to the board using conductive epoxy. In a preferred embodiment of the present invention, the pole piece 34 does not require conductive plating, and is approximately the same size as the magnet 30 and placed directly below the magnet 30, such that the magnetic field is concentrated in the area of the ferrite substrate 26 between the magnet 30 and the pole piece 34. The signal pads 38 and a large portion of the ground 28 are therefore not covered by the pole piece 34 and are easily accessible for surface mount connections.

In accordance with the present teachings, a ball grid array 50 including a plurality of solder balls 50 is attached to the ground 28 and signal pads 38 on the bottom of the substrate 26. At least one ball 50 is attached to each pad 38, and several balls are preferably attached to the ground 28. The final thickness of the solder balls 50 (after mounting) should be greater than the thickness of the pole piece 34, allowing the circulator 20 to be surface mounted without any obstructions.

Alternatively, the pole piece 34 may be plated with conductive material and sized to cover the entire ground layer 28 (with cut-outs for the areas around the signal pads 38). The solder balls 50 can then be attached to the pole piece 34, which is attached to the ground 28 using a solder re-flow. In this case, however, the pole piece 34 will be at a different height than the conductive pads 38 due to the height of the pole piece 34. To compensate for this height difference, the solder balls 50 attached to the pads 38 should be larger than the balls 50 attached to the ground/pole piece 34 such that all solder balls 50 will connect properly with the circuit board 12. Using a smaller, non-conductive pole piece 34 as shown in the preferred embodiment of FIG. 2b eliminates the height difference between the ground 28 and signal contacts 38 (and also eliminates the need to precisely shape the pole piece 34 to avoid the signal pads 38), and may therefore be simpler and less expensive to fabricate.

The edge metallization of the present invention may be fabricated by drilling holes into a wafer (which can make several circulators) of ferrite substrate 26, at the edge metallization locations 36. The top and bottom of the substrate 26 are covered with a layer of conductive material (using, for example, thin or thick film techniques), and the conductive material is deposited in the holes, covering the surfaces of the substrate in the hole (similar to making metallized vias). Transmission lines 24 connecting to the via holes are etched onto the top conductive layer, and an outline around each via hole is etched out of the bottom conductive layer to form conductive pads 38 that are separated from the ground layer 28. When the wafer is diced to form individual circulators, the via holes are sliced in half, leaving a conductive trace 36 on the side of the circulator substrate 26 that connects the transmission lines 24 on the top to the conductive pads 38 on the bottom. As shown in FIG. 2b, the edge wrapped lines 36 therefore have a rounded shape like a semi-circle. Other methods for forming the edge wrapped metallization may also be used without departing from the scope of the present teachings.

The magnet 30 and spacer 32 are then attached to the top of the substrate 26, and the pole piece 34 attached to the bottom of the substrate using non-conductive epoxy. Solder balls 50 are attached to the conductive pads 38 and ground plane 28. The circulator 20 is then ready to be mounted onto a circuit board. To reduce fabrication costs, it may be preferable to attach the magnet 30, spacer 32, pole piece 34, and solder balls 50 in wafer form, before slicing the wafer into the individual circulators.

To mount the circulator 20 onto a circuit board 12, the circulator 20 is placed onto the board 12 such that the solder balls 50 are properly aligned with the ground pad 16 and signal traces 18 on the board 12, as shown in FIG. 1a. The assembly 10 is then heated in a reflow oven to melt the solder balls 50, thereby attaching the circulator 20 to the board 12. Thus, both the ground and signal lines of the circulator 20 are connected to the circuit board 12 in a single, simple solder flow process. In fact, with the novel design of the present teachings, multiple circulators, as well as other surface mount components, can be attached to a circuit board in a single step, eliminating the more complex, multiple steps required with conventional die attach followed by wire bonding.

Thus, the present invention has been described herein with reference to a particular embodiment for a particular application. Those having ordinary skill in the art and access to the present teachings will recognize additional modifications, applications and embodiments within the scope thereof. For example, while the invention has been described with reference to BGA mounting, other mounting techniques such as pin grid array (PGA) may also be used without departing from the scope of the present teachings. The present teachings may also be applied to components other than circulators. For example, the present teachings may also be adapted to surface mount other types of components having microstrip transmission lines that need to be connected to a printed circuit board.

It is therefore intended by the appended claims to cover any and all such applications, modifications and embodiments within the scope of the present invention.

Accordingly,

What is claimed is:

1. A method for mounting a microstrip component onto a circuit board, the method comprising:

providing a component having a predetermined number of microstrip lines disposed on a first surface of a substrate and a ground layer disposed on a second surface of said substrate;

etching a predetermined number of electrical contacts on said second surface of said substrate;

coupling each said microstrip line to one of said electrical contacts;

connecting said electrical contacts and said ground layer to said circuit board using a ball grid array;

providing a magnet disposed on said first surface of said substrate over a resonator circuit connecting said microstrip lines; and providing a pole piece disposed on said second surface of said substrate beneath said ground layer, wherein said magnet and said pole piece are configured to provide a magnetic field in said substrate between said microstrip lines and said ground layer such that signals are coupled between said microstrip lines in a particular direction.

2. The invention of claim 1 wherein said coupling each said microstrip line to one of said electrical contacts comprises forming at least one via.

3. A method for fabricating a surface mount circulator, the method comprising:

providing a substrate;

etching a predetermined number of microstrip lines on a first surface of said substrate;

etching a ground layer and a predetermined number of conductive pads on a second surface of said substrate;

edge wrapping each microstrip line down a side of said substrate to connect with a corresponding conductive pad;

providing a magnet disposed on said first surface of said substrate over a resonator circuit connecting said microstrip lines; and providing a pole piece disposed on said second surface of said substrate beneath said ground layer, wherein said magnet and said pole piece are configured to provide a magnetic field in said substrate between said microstrip lines and said ground layer such that signals are coupled between said microstrip lines in a particular direction.

4. The invention of claim 3 wherein said conductive pads are coplanar with said ground layer.

5. The invention of claim 3 further comprising positioning a plurality of solder balls on said conductive pads, wherein said plurality of solder balls are configured to form a ball grid array.

6. The invention of claim 3 further comprising positioning a plurality of solder balls on said conductive pads, wherein said plurality of solder balls are configured to connect said conductive pads and ground layer to a circuit board.

7. The invention of claim 3 wherein said pole piece is smaller than said substrate such that said conductive pads and a portion of said ground are not covered by said pole piece.

8. The invention of claim 3 further comprising positioning a plurality of solder balls on said conductive pads, wherein said solder balls have a thickness greater than a thickness of said pole piece.

9. The invention of claim 3 wherein said substrate is ferrite.

10. The invention of claim 3 wherein said edge wrapping each microstrip line down said side of said substrate comprises forming at least one via.

11. The invention of claim 3 wherein said method further includes drilling via holes into a wafer of substrate material at each edge wrap location.

12. The invention of claim 11 wherein said method further includes covering a first surface and a second surface of said substrate wafer and said via holes with a layer of conductive material.

13. The invention of claim 12 wherein said method further includes etching said conductive layer on said first surface of said wafer to form microstrip lines connected to said via holes.

14. The invention of claim 13 wherein said method further includes etching an outline around each via hole in said conductive layer on said second surface of said wafer to form conductive pads adjacent to said via holes and said ground layer.

15. The invention of claim 14 wherein said method further includes dicing said wafer such that each via hole is sliced in half to form an edge wrapped line that connects a microstrip line and a conductive pad.

* * * * *